(12) United States Patent
Van Stryland et al.

(10) Patent No.: US 8,778,703 B2
(45) Date of Patent: Jul. 15, 2014

(54) EXTREMELY NON-DEGENERATE TWO PHOTON ABSORPTION OPTICAL SENSING METHOD, APPARATUS AND APPLICATIONS

(71) Applicant: University of Central Florida Research Foundation Inc., Orlando, FL (US)

(72) Inventors: Eric Van Stryland, Cape Canaveral, FL (US); David J. Hagan, Oviedo, FL (US)

(73) Assignee: University of Central Florida Research Foundation, Inc., Ithaca, NY (US)

(*) Notice: Subject to any disclaimer, the term of this patent is extended or adjusted under 35 U.S.C. 154(b) by 0 days.

(21) Appl. No.: 13/680,408

(22) Filed: Nov. 19, 2012

(65) Prior Publication Data

US 2014/0051191 A1    Feb. 20, 2014

Related U.S. Application Data (60) Provisional application No. 61/563,182, filed on Nov. 23, 2011.

(51) Int. Cl.
*H01L 21/268* (2006.01)

(52) U.S. Cl.
USPC .................. 438/16; 438/17; 438/14

(58) Field of Classification Search
CPC ...... H01L 21/268; H01L 21/428; H01L 22/14
USPC .............................. 438/14, 16, 17
See application file for complete search history.

(56) References Cited

U.S. PATENT DOCUMENTS

| | | | | |
|---|---|---|---|---|
| 6,400,165 | B1 * | 6/2002 | Knox et al. | 324/754.06 |
| 6,423,990 | B1 * | 7/2002 | El-Sharawy et al. | 257/197 |
| 7,008,559 | B2 * | 3/2006 | Chen | 252/301.6 S |
| 7,098,149 | B2 * | 8/2006 | Lukas et al. | 438/778 |
| 7,482,254 | B2 * | 1/2009 | Bakeman, Jr. | 438/528 |
| 8,588,570 | B2 * | 11/2013 | Rong et al. | 385/132 |
| 2013/0019944 | A1 * | 1/2013 | Hekmatshoar-Tabari et al. | 136/258 |

OTHER PUBLICATIONS

Bhaskar, Ajit et al.; Investigation of Two-Photon Absorption Properties in Branched Alkene and Alkyne Chromophores; J. Am. Chem. Soc. 2006, 128, 11840-11849.

Fishman, Dmitry A. et al.; Sensitive mid-infrared detection in wide-bandgap semiconductors using extreme non-degenerate two-photon absorption; Nature Photonics/ Advance Online Publicaiton; www.nature.com/naturephotonics, Aug. 7, 2011, 1-5.

* cited by examiner

*Primary Examiner* — Zandra Smith
*Assistant Examiner* — Damian A Hillman
(74) *Attorney, Agent, or Firm* — William Greener; Alek P. Szecy; Bond, Schoeneck & King, PLLC (57) ABSTRACT

An extremely non-degenerate two photon absorption (END-2PA) method and apparatus provide for irradiating a semiconductor material substrate simultaneously with two photons each of different energy less than a bandgap energy of the semiconductor material substrate but in an aggregate greater than the bandgap energy of the semiconductor material substrate. A ratio of a higher energy photon energy to a lower energy photon energy is at least about 3.0. Alternatively, or as an adjunct, the higher energy photon has an energy at least about 75% of the bandgap energy and the lower energy photon has an energy no greater than about 25% of the bandgap energy.

15 Claims, 3 Drawing Sheets

EXTREMELY NON-DEGENERATE TWO PHOTON ABSORPTION OPTICAL SENSING METHOD, APPARATUS AND APPLICATIONS

CROSS-REFERENCE TO RELATED APPLICATION

This application is related to, and derives priority from, U.S. Provisional Patent Application Ser. No. 61/563,182, filed 23 Nov. 2011 and titled Optical Sensing Method, Apparatus and Applications, the content of which is incorporated herein fully by reference.

STATEMENT OF GOVERNMENT INTEREST

The research that lead to the embodiments as disclosed herein, and the invention as claimed herein, was funded by: (1) the United States Army Research Office under grant number 50372-CHMUR; and (2) the United States Defense Advanced Research Project Administration under ZOE program grant number W31R4Q-09-1-0012. The United States Government has rights in the invention as claimed herein.

BACKGROUND OF THE INVENTION

1. Field of the Invention

The invention relates generally to optical sensing methods. More particularly, the invention relates to multi-photon optical sensing methods.

2. Description of the Related Art

The two-photon absorption (2PA) processes in semiconductor materials have been extensively studied both experimentally and theoretically, resulting in what are now well-established scaling rules that can accurately predict the degenerate two-photon absorption (D-2PA) of direct-gap semiconductor materials. These scaling rules show that D-2PA is inversely proportional to the cube of the energy gap, $E_g$. This means that the D-2PA coefficients in narrow-gap semiconductor materials are two to three orders of magnitude greater than the absorption in large gap semiconductor materials.

For example, ZnO ($E_g$=3.2 eV) has a D-2PA two-photon absorption coefficient, approximately 5 cm/GW at 532 nm, while for InSb ($E_g$=0.23 eV), approximately 2 cm/MW in the range 8 to 12 μm. 2PA coefficients in the cm/MW range may prove useful for practical applications, but these scaling rules imply that such large values are not accessible in the near infrared (NIR)/visible (VIS) range.

Since two-photon absorption processes within semiconductor materials are likely to continue to remain important within the context of several applications, desirable are additional semiconductor material based two-photon absorption processes that provide unique optical capabilities.

SUMMARY

Embodiments are predicated upon the observation that for non-degenerate two-photon absorption (ND-2PA), the energies of individual photons may approach intermediate-state resonances that allow the 2PA to become much larger than in the degenerate case. In the case of 2PA for a two-band model, the dominant transitions are either inter-band ("direct/allowed") or intraband "self/forbidden." This suggests that such intermediate state resonances can become significant only when using photons with energies either very small or approaching the bandgap energy, such that the two photons employed in the process would have extremely different energies, but where the sum of the two photon energies still exceeds $E_g$.

Embodiments thus provide extremely ND-2PA (END-2PA) methodology and apparatus while using any direct bandgap semiconductor, such as but not limited to ZnSe and GaAs semiconductor materials, and several other semiconductor materials, along with theoretical calculations showing that END-2PA can exceed their degenerate counterparts by one to three orders of magnitude. The embodiments consider END-2PA as a non-degenerate process where the possible "intermediate" states lie energetically very close to both the initial state (in the valence band) or the final state (in the conduction band). This generally implies that the lower energy photon energy is much less than half the bandgap energy, placing it in the infrared (IR), including but not limited to the near infrared (NIR) and the mid-infrared (MIR), when the semiconductor materials have visible or NIR wide bandgap energies. As the lower energy photon moves further into the IR significant enhancements may be realized. This allows the extremely large 2PA coefficients, previously only seen in narrow-gap semiconductors, to be observed in larger-gap semiconductors with direct bandgaps, such as but not limited to CdTe, GaAs, ZnSe, ZnO, and ZnS. The large enhancement of 2PA can be useful for optical switching, infrared (IR) detection and could have important consequences for lasers and amplifiers based on two-photon gain. Within the context of Kramers-Kronig relations to obtain the dispersion of the nonlinear refraction, one may also predict an enhancement of the non-degenerate nonlinear refractive index n2; however, positive and negative contributions from the two-photon, Raman and AC-Stark terms lead to a smaller enhancement but an extremely rapid dispersion in the 2PA region.

Thus, embodiments provide a method and related apparatus predicated upon an END-2PA method that uses a higher energy photon and a lower energy photon, neither of which has an energy that exceeds the bandgap energy of a semiconductor material, but in the aggregate have an energy that exceeds the bandgap energy of the semiconductor material. The END-2PA method provides for simultaneous irradiation of an appropriate semiconductor material substrate with the higher energy photon having a comparatively higher energy and the lower energy photon having a comparatively lower energy where a ratio of the comparatively higher energy and the comparatively lower energy is at least about (or alternatively greater than about) 3.0, preferably at least about or greater than about 3.5 and more preferably at least about or greater than about 4.0.

Alternatively, or as an adjunct, the foregoing ratio may be realized when the higher energy photon has an energy at least about (or alternatively greater than about) 75% of the bandgap energy (preferably about 80% of the bandgap energy and more preferably about 90% of the bandgap energy) and the lower energy photon has an energy no greater than about (or preferably less than about) 25% of the bandgap energy (more preferably about 20% of the bandgap energy and more preferably about 10% of the bandgap energy).

The particular method in accordance with the embodiments provides an opportunity for enhanced sensitivity detection and imaging by using the semiconductor as a gated detector for observing the presence of subgap radiation. The detector is only turned on when one of the 2 subgap beams is present. This also works with or without cooling. This single pixel can scan an image or can be used in a multi pixel array for direct imaging. Also, since it is gated, it can be used as in a LIDAR system to provide 3-dimensional information, where the depth information resolution is determined by the gating source pulse duration. This could be extended to creating an imaging array under circumstances where the semiconductor material substrate may be provided within the context of a pixel array imaging apparatus.

A particular method in accordance with the embodiments includes providing a semiconductor material substrate having a bandgap energy. This particular method also includes irradiating the semiconductor material substrate simultaneously with two photons of different energy each individually less than the bandgap energy, but in an aggregate greater than the bandgap energy, where: (1) a higher energy photon has an energy at least about 75 percent of the bandgap energy; and (2) a lower energy photon has an energy no greater than about 25 percent of the bandgap energy.

Another particular method in accordance with the embodiments includes providing a semiconductor material substrate having a bandgap energy. This other particular method also includes irradiating the semiconductor material substrate simultaneously with two photons of different energy each individually less than the bandgap energy, but in an aggregate greater than the bandgap energy, where a ratio of photon energies for a higher energy photon to a lower energy photon is at least about 3.0.

A particular apparatus in accordance with the embodiments includes a semiconductor material substrate having a bandgap energy. This particular apparatus also includes means for irradiating the semiconductor material substrate simultaneously with two photons of different energy each less than the bandgap energy but in an aggregate greater than the bandgap energy, where: (1) a higher energy photon has an energy at least about 75 percent of the bandgap energy; and (2) a lower energy photon has an energy no greater than about 25 percent of the bandgap energy.

Another particular apparatus in accordance with the embodiments includes a semiconductor material substrate having a bandgap energy. This other particular apparatus also includes means for irradiating the semiconductor material substrate simultaneously with two photons each of energy less than the bandgap energy but in an aggregate of energy greater than the bandgap energy, where a ratio of photon energies for a higher energy photon to a lower energy photon is at least about 3.0.

BRIEF DESCRIPTION OF THE DRAWINGS

The objects, features and advantages of the embodiments are understood within the context of the Detailed Description of the Embodiments, as set forth below. The Detailed Description of the Embodiments is understood within the context of the accompanying drawings, that form a material part of this disclosure, wherein.

DETAILED DESCRIPTION OF THE EMBODIMENTS

The embodiments provide, among other features, an END-2PA method and a related apparatus. The END-2PA method and the related apparatus are predicated upon a semiconductor material substrate having a bandgap energy $E_g$ and the irradiation of the semiconductor material substrate with two photons of different energy each less than the bandgap energy but in an aggregate greater than the bandgap energy. A ratio of the energy of a higher energy photon with respect to a lower energy photon is at least about 3.0. Generally this constraint may be met when: (1) the higher energy photon has an energy at least about 75% of the bandgap energy $E_g$; and (2) the lower energy photon has an energy no greater than about 25% of the bandgap energy $E_g$. The embodiments provide value insofar as the embodiments provide for enhanced sensitivity measurements within the END-2PA method.

1. Basic Considerations

In accordance with the above, an END-2PA method in accordance with the embodiments provides for simultaneous irradiation of a particular semiconductor material substrate with two photons, each photon individually having an energy less than a bandgap energy $E_g$ of the semiconductor material, but in an aggregate the two photons having an energy greater than the bandgap energy $E_g$ of the semiconductor material. Within the embodiments a ratio of the photon energies of the higher energy photon to the lower energy photon is at least about 3.0. Typically, this provides the higher energy photon of energy at least about 75% of the bandgap energy, and the lower energy photon of energy no greater than about 25% of the bandgap energy.

As a result of the simultaneous irradiation of the particular semiconductor material substrate with the two photons as described above, a material property of the semiconductor material that comprises the semiconductor material substrate is reversibly changed at a location of the semiconductor material substrate simultaneously irradiated with the two photons. By such a "reversibly changed" material property the embodiments intend a transient change in value of a particular material property of a semiconductor material substrate upon simultaneous irradiation with the two photons and a return to an original value of the particular material property upon cessation of irradiation of the semiconductor material substrate simultaneously with the two photons. The material property that is changed is often quite dramatically changed (i.e., a change of at least about 10 times), in comparison with separate individual irradiation by the two photons under otherwise analogous conditions. The material property that is changed may include but is not necessarily limited to an optical transmittance and an electrical conductivity.

The embodiments include semiconductor material substrates that include any direct-gap semiconductor material, including but not limited to InGaAs, CdTe, GaAs, ZnSe, ZnO, ZnS and GaN. These semiconductor material substrates may have a bandgap energy $E_g$ at least about (or alternatively greater than about) 0.7 eV (preferably 2.0 eV and more preferably 2.5 eV).

The embodiments may be useful in providing applications including but not limited to optical switching applications and infrared (IR) detection applications. As well, embodiments may also have implications for lasers and amplifiers based on two-photon gain sensor applications, and also imaging applications.

Embodiments thus contemplate methods and apparatus that provide for simultaneous irradiation of a semiconductor material substrate with two photons. Embodiments also contemplate methods and apparatus that provide for simultaneous continuous complete irradiation of a semiconductor material substrate with two separate photon irradiation beams each having a different energy. Alternatively, embodiments also contemplate methods and apparatus that provide for continuous complete illumination of a semiconductor material substrate with a first photon radiation beam (of either the higher photon energy or the lower photon energy) and an intermittent pulsed and/or spatially specific illumination of the semiconductor material substrate with the second photon irradiation beam (i.e., having the complementary photon energy).

2. Theoretical Background

While data for ND-2PA exist from earlier experimental work, no other data apparently exist with a ratio of photon energies larger than 3.0. As seen from Eq. (1) this is an interesting realm to investigate since as the intermediate state for the transition approaches an eigenstate of the system, the 2PA is expected to diverge (of course adding in decay insures overall convergence). In the case of END-2PA there are two resonances that can be exploited. The allowed-forbidden transitions dominate 2PA in direct-gap semiconductors so that the small energy photon can become near resonant to the "forbidden" or self-transition while the large energy photon can be nearly bandgap resonant. This is illustrated in FIG. 1, and may be easily seen qualitatively from the expression for the ND-2PA rate, $W_2^{ND}$, which can be written in the perturbative framework as $$W_2^{ND} = \frac{2\pi}{\hbar} \sum_{vc} \left| \sum_i \left[ \frac{\langle c|H_2|i\rangle\langle i|H_1|v\rangle}{E_{iv}(k) - \hbar\omega_1} + \frac{\langle c|H_1|i\rangle\langle i|H_2|v\rangle}{E_{iv}(k) - \hbar\omega_2} \right] \right|^2 \quad (1)$$

$$\delta[E_{cv}(k) - \hbar\omega_1 - \hbar\omega_2]$$

with indices 1 and 2 designating the two photons, H the electron-field interaction Hamiltonian and v, c and i the valence, conduction and intermediate states, respectively.

Figure 1:
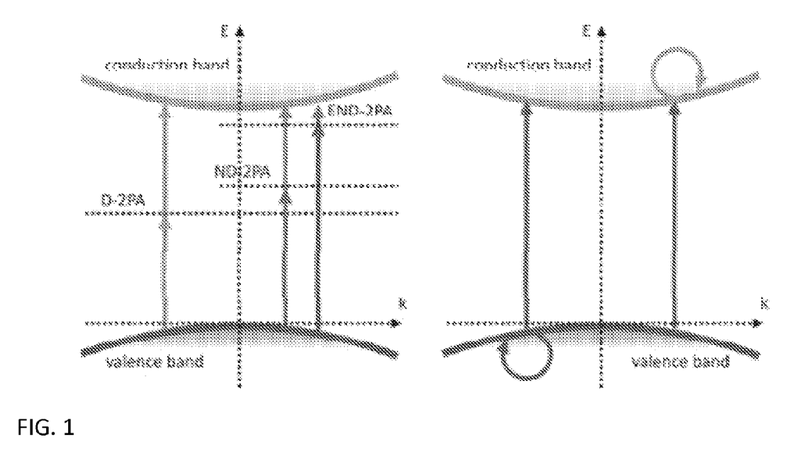
FIG. 1. (a) Schematic representation of transitions involved in a 2PA process for photons having various energy ratios, with ND-2PA and END-2PA characterized by a small detuning energy as compared to the bandgap. (b) The equivalent representation within the perturbative framework showing the possible transitions for two-band structure consisting of direct ("allowed") and self ("forbidden") transitions.

If one considers the simple model of a two-band direct-gap semiconductor, the virtual state can be taken as either the initial state (in the valence band) or the final state (in the conduction band) for the electron transition, in which case one resonance occurs for both the low and high-energy photons (see FIG. 1b). For this case, since $E_{iv}$ is either equal to 0 or to $E_{cv} = \hbar\omega_1 + \hbar\omega_2$, one can write explicitly the contributions from different paths of evolution for the system and obtain $$W_2^{ND} \sim \left| \frac{M_{vc}^2 M_{vv}^1}{-\hbar\omega_1} + \frac{M_{vc}^1 M_{vv}^2}{-\hbar\omega_2} + \frac{M_{cc}^2 M_{vc}^1}{\hbar\omega_2} + \frac{M_{cc}^1 M_{vc}^2}{\hbar\omega_1} \right|^2, \quad (2)$$

where $M_{ij}^{1,2} = \langle j|H_{1,2}|i\rangle$ are the corresponding matrix elements. The matrix elements are linear in the amplitude of the magnetic vector potential associated with the respective fields, which in turn are expressed in terms of ratios of square root of irradiances divided by photon energies. Overall, taking also into account the expression of non-degenerate 2PA $\alpha_2(\omega_1:\omega_2) = \hbar\omega_1 W_2^{ND}/(I_1 I_2)$, one obtains a complex and stronger dependence on the photon energies of the interacting fields as exemplified below with the functional form of 2PA. Smaller photon energies will decrease the denominator values thus increasing the 2PA. It is important to observe here that each of the two different possible transition sequences yields a term enhanced significantly by the presence of a small energy photon. This effect is similar to the intermediate state resonance enhancement (ISRE) predicted and seen in molecular systems. In direct-gap semiconductors the one-photon absorption (1PA) edges are generally sharper than those of organics and therefore larger enhancements may be obtained when probing very close to the linear absorption range.

Theoretical calculations of third-order nonlinearities in semiconductors are very well documented, and there are a couple of approaches commonly used in the past. One of the methods involves the use of second-order perturbation theory, as in Eq. (1), to directly calculate the transition rates using a quantum mechanical description (eigenvalues and eigenstates) of the considered systems. Reasonable predictions can be made either using a simple two-parabolic band model or one can employ complex 4- or 7-band calculations for better accuracy, which can go as far as predicting the anisotropy of the nonlinear coefficients for particular systems like the ones exhibiting zinc-blende symmetry. The 2PA spectra obtained with these models are similar as more complex numerical calculations only lead to shifts in the magnitudes of the coefficients producing minor changes to the spectral shapes. This is quite different from the case of three-photon absorption (3PA) where different pathways result in quantum interference leading to very different results depending on the band model used. Another theoretical method that was successfully used in the past and in the calculations shown above, is based on Keldysh's tunneling theory. It uses a scattering matrix formalism with Volkov-type "dressed" wavefunctions for the electronic states in order to account for the effect of the electric field on the system. This provides similar 2PA spectra to the perturbation methods and yields identical results for the simple case of two-parabolic bands and D-2PA. The ND-2PA coefficient $\alpha_2 (\omega_1:\omega_2)$ is calculated in this scattering matrix formalism with two parabolic bands to be:

$$\alpha_2(\omega_1; \omega_2) = K \frac{\sqrt{E_p}}{n_1 n_2 E_g^3} F_2 \left( \frac{\hbar\omega_1}{E_g}; \frac{\hbar\omega_2}{E_g} \right), \quad (3)$$

where $$F_2(x_1; x_2) = \frac{(x_1 + x_2 - 1)^{3/2}}{2^7 x_1 x_2^2} \left( \frac{1}{x_1} + \frac{1}{x_2} \right)^2,$$

for the optical frequencies $\omega_{1,2}$, Ep is the Kane energy parameter, Eg is the bandgap energy, $n_{1,2}$ are the refractive indices, and K is a material independent parameter. One may consider that a similar expression is obtained using the perturbation approach.

3. Experimental Results

The experimental ND-2PA spectra presented in accordance with the embodiments were taken in a standard pump-probe non-collinear geometry with a small angle (~7 degrees) between the pump and the probe beams, using either picosecond or femtosecond pulses. The temporal scans were obtained by delaying either the pump (femtosecond data) or the probe (picosecond data) using a retroreflector mounted on a computer-controlled motorized translation stage. The picosecond pump-probe experiments were performed using a 10 Hz EKSPLA laser system (PL-2143C). It consisted of a ~30 ps FWHM modelocked Nd:YAG 1064 nm laser, converted to the third harmonic at 355 nm and pumping two LBO-based optical parametric generation/amplification (OPG/OPA) devices. The IR pump beam for the experiments was obtained through a difference frequency generation (DFG) process in a GaSe crystal using 1064 nm from the laser and the idler beam from a second similar OPG/OPA system. The IR pumping wavelength was chosen to be 8840 nm corresponding to approximately 10% of the bandgap of GaAs, which together with CdTe were the two semiconductors studied in this configuration. The choice of pump wavelength was also based on the available tuning range of the IR (8-14 μm) and taking into account the energy and beam quality at the output wavelengths. The probe beam was selected by tuning the idler output to individual wavelengths in the near-IR. The probe beam had a maximum energy of a few nJs and a smaller spot size than that of the pump, as measured by knife-edge scans, with a ratio of 1:2. This assured an irradiance in the probe beam smaller by at least a factor of 100 than the pump beam irradiance. In our configuration, this caused minimal losses through D-2PA of the probe (<0.5%, which is at our noise level).

A similar setup was used for the femtosecond experiments. The system consisted of a 1 kHz Clark MXR Ti:Sapphire laser pumping two BBO-based TOPAS OPG/OPA systems from Light Conversion Inc. with an infrared beam obtained through DFG in a AgGaS2 crystal, like in the case of the picoseconds system. The pump used for these experiments is in the wavelength range of 1200 nm to 5600 nm, corresponding to approximately 30% to 8% of the bandgap energy for the semiconductors studied (ZnSe, ZnS, ZnO). Depending on wavelength, it can be either the idler output of the TOPAS or obtained through DFG. Autocorrelation measurements of the pulsewidths yield values of ~140 fs FWHM. The probe was obtained from a white-light continuum (WLC) generated using the 1300 nm signal beam from the TOPAS into a 2 mm thick piece of CaF$_2$. Individual wavelengths are selected from the WLC using a set of interference filters with a spectral bandwidth of ~10 nm. The temporal width of the spectrally filtered pulses was between 140 fs and 160 fs as verified by autocorrelation experiments. The pump to probe spot size ratio is ~7 to 1 giving a minimum ratio for the pump to probe irradiance of 20. Similar to the picoseconds experiments, the probe energy was small enough that any self-induced probe beam 2PA can be neglected.

In all nondegenerate experiments, the pump or excitation beam (Ie), is always at the longer wavelength, with photon energies less than a third of the bandgap. This was to avoid any 2PA or 3PA caused by the pump itself which would complicate the experiment and the analysis of the experimental data, and would lead to the creation of free-carrier pairs which would cause extra losses especially for longer pulses. Hence, absorption was solely caused by ND-2PA with one photon being absorbed from each beam. Although this absorption also produced free carriers, the density of carriers produced is proportional to the photon density from the weak probe beam which was deliberately kept very small. For our experiments, effects of free-carrier absorption and refraction can be ignored altogether. Thus, the irradiance dependent pump-probe results are modeled by, $$\frac{dI_p(\omega_p)}{dz} = -2\alpha_2(\omega_p; \omega_e) I_e(\omega_e) I_p(\omega_p). \quad (4)$$

The second reason the low photon energy beam was used as the pump was related to the magnitude of the 2PA coefficient, which scales with the photon energy at which the absorption was monitored. The frequency dependence of the 2PA coefficient (3) through the F2 function leads to the relation $\alpha_2(\omega_p: \omega_e) \alpha_2 (\omega_e:\omega_p)=(\omega_p/\omega_e)$. This is because the rate of photon loss must be the same for both beams, hence the energy loss rate is larger for the beam with higher energy photons. Because the photon loss rates are identical, the carrier generation rate is symmetric in the two wavelengths. Thus, the END enhancement in two photon detection is the same regardless of which wavelength is the signal or the gate.

Figure 2:
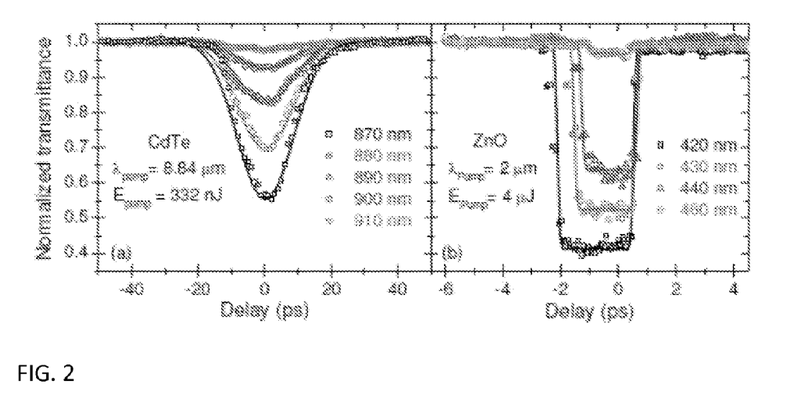
FIG. 2. Typical experimental pump-probe data in CdTe (a) using picoseconds pulses and ZnO (b) using femtosecond pulses along with theoretical fits (solid lines).

The use of a low frequency pump allows for the variation of the probe frequency only over a limited range set by the lowest energetically possible transition and the linear absorption edge, i.e. the probe photon energy can be varied between Eg−ħ$\omega_e$ and Eg. Typical experimental data are shown in FIG. 2 for CdTe with picosecond pulses (a) and ZnO with femtosecond pulses (b). In the picosecond experiments, ħ$\omega_e$ is approximately 9.3% of the CdTe bandgap. For the case of femtosecond experiments there are more choices for the pump wavelength. In ZnO, for instance, one may choose ħ$\omega_e$ equal to ~32%, 23%, 19.5%, 17% and 15.5% of Eg. The lowest pump energy corresponds to 2.5 μm which is at the end of the femtosecond OPG/OPA tuning range. Using DFG one may use a pump wavelength of 5.6 μm in ZnSe, which corresponds to about 8% of the bandgap energy.

For femtosecond pulses, group velocity dispersion (GVD) plays a very important role. This is apparent in the shape of our temporal pump-probe curves as seen in FIG. 2b. Because the group velocity varies strongly with wavelength, for a large range of initial delays, the pump (fast) and probe (slow) walk through each other as they propagate through the sample. The measured effect is a consequence of "effective" temporal overlaps, and as this "effective" overlap distance is smaller than the sample thickness one may obtain the same change in transmittance for a range of initial delays. The data were analyzed taking these effects into consideration. It should be mentioned that the new femtosecond data shown here is collected without the use of modulation techniques.

Figure 3:
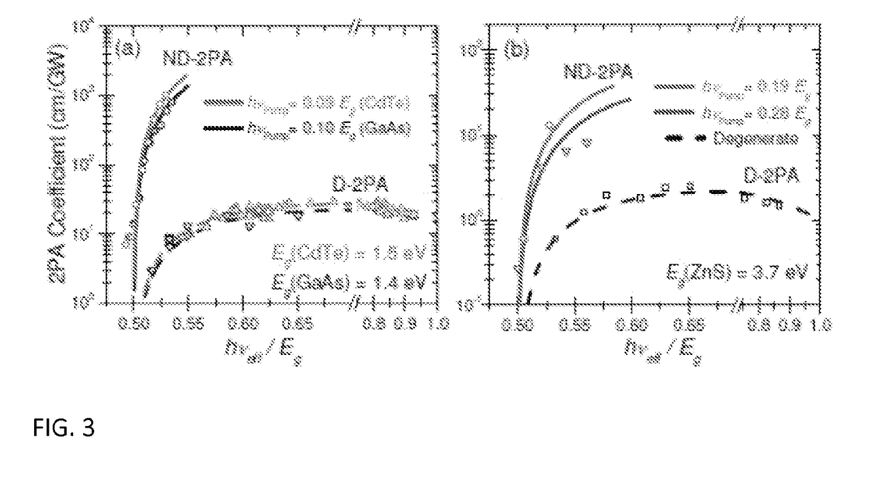
FIG. 3. Non-degenerate 2PA spectra of CdTe and GaAs measured with picosecond pulses (a) and of ZnS measured with femtosecond pulses (b). The theoretically calculated non-degenerate spectra are shown with straight lines, while the dashed lines denote the respective degenerate spectra, along with measured degenerate data.

In FIG. 3 (a) are show the measured END-2PA spectra of GaAs and CdTe along with the calculated curves and plotted versus the average photon energy, thus comparing the coefficients for two transition processes between the same energy levels. This allows convenient representation of the data on the same graph along with the degenerate 2PA spectrum taken with the femtosecond system using the Z-Scan technique. In all plots the photon energies are shown scaled to the respective bandgap energies since this allows comparing different semiconductors on the same scale and makes the comparison to the respective degenerate values easier. The theoretical values are represented with solid lines together with measured degenerate data. The measured nondegenerate values are as large as 1 cm/MW, ~180× larger than the corresponding degenerate values and about 40× larger than the peak value for the degenerate 2PA. There is a remarkable agreement between the measured and the predicted values using the simple two parabolic-band model over a large range of photon energies. This agreement is not entirely surprising since in experiments with very nondegenerate photons the states involved in transitions are close to the center of the Brillouin zone where the parabolic approximation works best. However, one is able to measure some small signals when the sum of the energies of the two photons falls below the band edge. The analysis shows that the signals are linear in pump energy confirming a ND-2PA process as one is accessing states within the Urbach tail. Due to the large enhancement one is able to measure such small contributions which would otherwise be impossible to do using degenerate photons. Thus END-2PA may be useful for studying the impurity and defect absorption in the Urbach tail.

Figure 4:
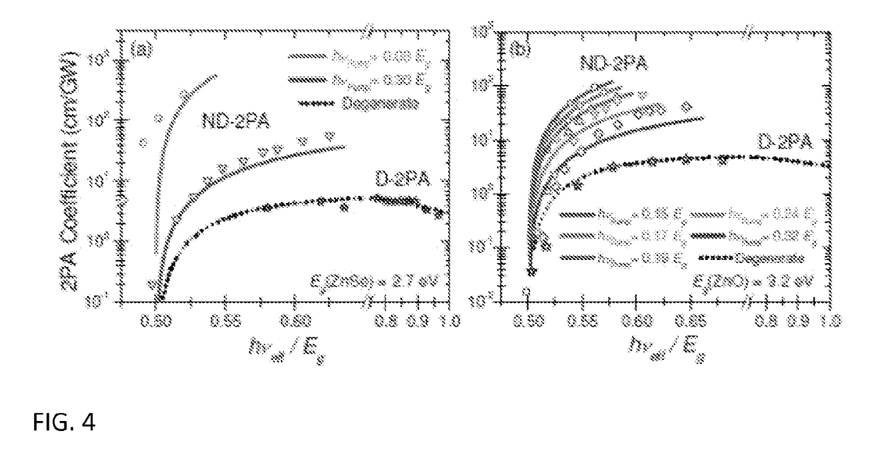
FIG. 4. Non-degenerate 2PA spectra of ZnSe (a) and ZnO (b) measured with femtosecond pulses. The theoretically calculated non-degenerate spectra are shown with straight lines, while the dashed lines denote the respective degenerate spectra, along with measured degenerate data.

A summary of results obtained using femtosecond pulses is presented in FIG. 3(b) for ZnS and in FIG. 4 for ZnSe (a) and ZnO (b). For these cases the choices of pump and probe photon energies are limited by the specifics of the experimental apparatus. Taking data with small photon energies in the pump beam proved difficult for the largest bandgap semiconductors, since for these cases the probe photons are close to the UV, and in our continuum the energies available for this part of the spectrum are low. The smallest pump photon energy corresponds to approximately 15.5%, 8% and 19% of the bandgap of ZnO, ZnSe and ZnS, respectively. Consequently, the measured maximum enhancement of the nondegenerate values with respect to the degenerate ones varies strongly with the pump photons' energy, reaching ~40 in ZnO and ~270 in ZnSe. As shown, there is again good agreement between theory and femtosecond experimental data. Similarly, the plotted degenerate data was taken using the femtosecond system using the Z-scan technique.

4. Discussion

The data taken on ZnO best illustrates the strong dependence of the measured values on the pump wavelength. The longer the pump wavelength, the stronger is the enhancement seen in the 2PA. The largest overall magnitude measured is about 1 cm/MW using the mid-IR pump. These nonlinearities are measured at visible and near IR wavelengths and their magnitudes come close to the degenerate values measured in narrowgap semiconductors (e.g. InSb, InAs, etc.) at wavelengths in the mid-infrared. This can be understood by considering the perturbative expression (Eq. (2)) of the 2PA rate when using a simple two-band model for a given pair of initial and final states. For the nondegenerate case, the energy term in the denominator gets as small as the pump energy with one of the two terms being highly enhanced for either of the transition paths possible (a first "self" transition followed by a direct transition or vice versa) as is written in Eq. (5).

$$W_2^D \propto \left| \frac{M_{vc}^{(2)} M_{vv}^{(2)}}{-\hbar\omega_2} + \frac{M_{cc}^{(2)} M_{vc}^{(2)}}{\hbar\omega_2} \right|^2. \quad (5)$$

If one now considers the case of D-2PA in a direct narrowgap semiconductor at the pump wavelength (energy of $\hbar\omega_2$), one obtains two terms with the same denominator energy values. Since the momentum matrix elements depend mainly on the symmetry of the bands involved, for similar systems (zincblende structures for instance) one might expect values of the same order of magnitude. The difference here, however, is the necessity of having only one long wavelength photon. Also, to obtain the highest nonlinearities it is necessary to probe close to the linear absorption edge, effectively narrowing the available spectral range. To overcome this, a very high quality sample should be used, possibly at a low temperature in order to minimize any linear losses on the probe beam. However, there is an upper limit to the nonlinearities that can be obtained in a nondegenerate configuration. The main limitation is the linear absorption at the probe wavelength below the bandgap, i.e. Urbach tail absorption. Assuming the upper energy limit for the probe photons set to 0.97 of the bandgap energy, by using pump photons at about 5% of the bandgap energy one would theoretically obtain an increase of the 2PA coefficient of only about 2× versus pumping with photons at 10% of the bandgap. It is important to mention that such enhancements can be obtained in any direct-gap system provided that appropriate photon pairs are used. In systems with strict selection rules there are additional restrictions which may put an upper practical limit on the measured enhancement.

For the highly nondegenerate experiments, the behavior of the Kerr index in particular spectral ranges is also very interesting. The nondegenerate nonlinear index can be obtained using the general expression of the change in absorption caused by the presence of a pump beam and performing a Kramers-Kronig transformation. The nonlinear refractive index contains contributions from the 2PA, Raman and Stark processes.

The 2PA terms gives the main contribution, positive for lower energy photons and negative for energies close to the bandgap. The Stark terms give an overall negative contribution to the nonlinear index, which increases asymptotically close to the band edge, while the Raman term adds positively.

Figure 5:
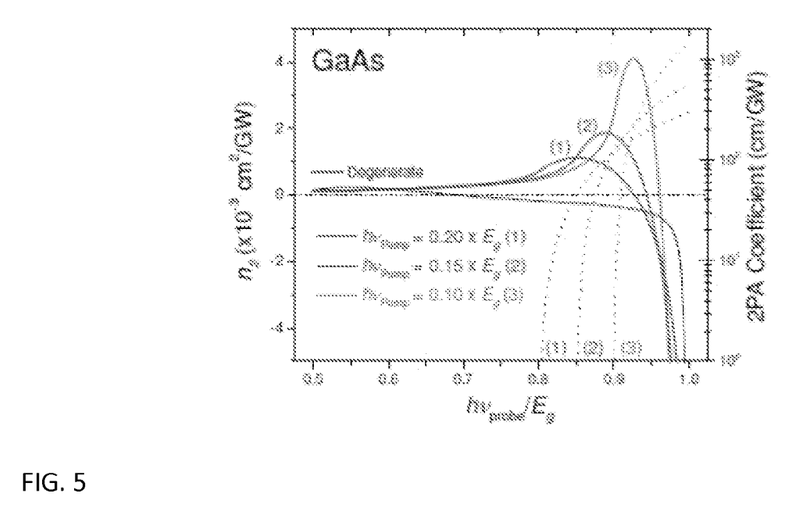
FIG. 5. Calculated nondegenerate induced refraction index (solid lines) and nondegenerate 2PA (dotted lines) of GaAs for pump energies equal to (1) 20% (4.32 µm), (2) 15% (5.81 µm) and (3) 10% (8.84 µm) of the bandgap.

For the nondegenerate case, this makes the calculated overall enhancement relatively smaller than for 2PA when using small photon energy pumps. The nonlinear index takes positive values (focusing nonlinearity) for small probe frequencies and turns negative (defocusing nonlinearity) for frequencies close to the 1PA edge. The probe frequency for which the nonlinear index becomes zero depends strongly on the pump frequency. This zero crossing occurs near the peak of the 2PA for the degenerate case approaching frequencies very close to the linear absorption edge as the energy of the pump photons is decreased. The slope of the spectrum near the zero crossing point also changes strongly with the pump photons' energy and becomes extremely steep for small energy pump photons. This leads to changes in the sign of the refractive nonlinearity over very narrow spectral ranges. These trends are shown in FIG. 5 for the particular case of GaAs.

When pumping at ~10% of the bandgap (8.84 um), by varying the probe wavelength by ~13 nm, from 903 nm to 916 nm, one may vary the n2 from approximately $-2 \times 10^{-12}$ cm$^2$/W to $2 \times 10^{-12}$ cm$^2$/W, numbers that in absolute value correspond with about 50% of the peak n2. To verify this, picosecond pulses would be more suitable because of their narrower spectral widths; however, it would also be interesting to study the effect of this spectral dependence on a femtosecond pulse with a large bandwidth centered near the zero crossing frequency. Unfortunately, from the standpoint of applications, the nonlinear refraction is largely enhanced in spectral regions where the 2PA is also enhanced, see FIG. 5. To minimize losses, future applications would require avoiding these enhanced 2PA ranges, making use of only moderate enhancements in nonlinear refraction and the judicious choice of direct-gap semiconductor.

5. Conclusions

Measured were nondegenerate 2PA spectra of several semiconductors (CdTe, GaAs, ZnS, ZnSe, and ZnO) using pairs of extremely nondegenerate photons. The magnitude of the 2PA coefficients increased dramatically when low energy pump photons, compared to the bandgap energy, were used. Very good agreement with calculations based on the "dressed" wavefunctions approach is shown. For experiments in ZnSe, the measured non-degenerate 2PA is as large as 270× the corresponding degenerate 2PA value when pumping with low energy photons of 0.08 Eg. This corresponds to a 50× increase over the peak degenerate 2PA coefficient. Using even lower photon energies is theoretically predicted to lead to larger enhancements. The large nonlinearities measured, minimization of free-carrier effects, and the possibility to tailor the Kerr index behavior by the appropriate choice of wavelengths, suggest that efficient all-optical switching may be implemented. These large enhancements made possible the demonstration of gated detection in a room temperature GaN photodiode with very good sensitivity. This large enhancement of the 2PA coefficient also translates directly to enhanced two-photon gain, which opens the possibility of highly nondegenerate two-photon tunable laser and amplifier device applications. However, it remains to be seen if the strong enhancement in two-photon emission would be sufficient to overcome the large free-carrier losses of the infrared wave in such devices.

All references, including publications, patent applications, and patents cited herein are hereby incorporated by reference in their entireties to the same extent as if each reference was individually and specifically indicated to be incorporated by reference and was set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein is merely intended to serve as a shorthand method of referring individually to each separate value falling within the range, unless otherwise indicated herein, and each separate value is incorporated into the specification as if it was individually recited herein. Use of the terminology "about" with respect to ranges is intended to include a 10% uncertainty, unless clearly indicated otherwise, or indicated otherwise by context.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A method, comprising:
    providing a semiconductor material substrate having a bandgap energy; and
    irradiating the semiconductor material substrate simultaneously with two photons of different energy each individually less than the bandgap energy, but in an aggregate greater than the bandgap energy, where:
    a higher energy photon has an energy at least about 75 percent of the bandgap energy; and
    a lower energy photon has an energy no greater than about 25 percent of the bandgap energy.

2. The method of claim 1, wherein the simultaneous irradiation of the semiconductor material substrate with the two photons of different energy reversibly changes a material property of the semiconductor material substrate at a location of the simultaneous irradiation of the semiconductor material substrate by the two photons of different energy.

3. The method of claim 2, wherein the material property is selected from the group consisting of an optical transmittance and an electrical conductivity.

4. The method of claim 1, wherein the bandgap energy is at least about 0.7 eV.

5. The method of claim 1, wherein the semiconductor material substrate comprises a direct gap semiconductor material.

6. A method, comprising:
    providing a semiconductor material substrate having a bandgap energy; and
    irradiating the semiconductor material substrate simultaneously with two photons of different energy each individually less than the bandgap energy, but in an aggregate greater than the bandgap energy, where a ratio of photon energies for a higher energy photon to a lower energy photon is at least about 3.0.

7. The method of claim 6, wherein the simultaneous irradiation of the semiconductor material substrate with the two photons of different energy reversibly changes a material property of the semiconductor material substrate at a location of the simultaneous irradiation of the semiconductor material substrate by the two photons of different energy.

8. The method of claim 7, wherein the material property is selected from the group consisting of an optical transmittance and an electrical conductivity.

9. The method of claim 6, wherein:
    the higher energy photon has an energy at least about 75 percent of the bandgap energy; and
    the lower energy photon has an energy no greater than about 25 percent of the bandgap energy.

10. The method of claim 6, wherein the bandgap energy is at least about 0.7 eV.

11. The method of claim 10, wherein the semiconductor material substrate comprises a direct gap semiconductor material.

12. The method of claim 11, wherein the direct gap semiconductor material is selected from the group consisting of InGaAs, CdTe, GaAs, ZnSe, ZnO, ZnS and GaN.

13. The method of claim 6, wherein the two photons are provided simultaneously in a continuous irradiation.

14. The method of claim 6, wherein the two photons are provided in a continuous irradiation and in a pulsed irradiation.

15. The method of claim 6, further comprising measuring an electrical current generation within the semiconductor material substrate as a function of irradiation by the two photons of different energy.

* * * * *

UNITED STATES PATENT AND TRADEMARK OFFICE
CERTIFICATE OF CORRECTION

| | | |
|---|---|---|
| PATENT NO. | : 8,778,703 B2 | Page 1 of 1 |
| APPLICATION NO. | : 13/680408 | |
| DATED | : July 15, 2014 | |
| INVENTOR(S) | : Eric Van Stryland et al. | |

It is certified that error appears in the above-identified patent and that said Letters Patent is hereby corrected as shown below:

On The Title Page,

Item (73), please change "Ithaca, NY (US)" to --Orlando, FL (US)--.

Signed and Sealed this
Third Day of March, 2015

Michelle K. Lee
*Deputy Director of the United States Patent and Trademark Office*